United States Patent
Saitou

(10) Patent No.: US 7,405,602 B2
(45) Date of Patent: Jul. 29, 2008

(54) RESET CONTROL CIRCUIT AND RESET CONTROL METHOD

(75) Inventor: Teruhiko Saitou, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 39 days.

(21) Appl. No.: 11/063,975

(22) Filed: Feb. 24, 2005

(65) Prior Publication Data
US 2006/0103436 A1    May 18, 2006

(30) Foreign Application Priority Data
Nov. 17, 2004    (JP) .............................. 2004-332956

(51) Int. Cl.
*H03L 7/00* (2006.01)
(52) U.S. Cl. ...................... 327/142; 327/198
(58) Field of Classification Search ................. 327/142, 327/143, 198
See application file for complete search history.

(56) References Cited

U.S. PATENT DOCUMENTS

| | | | | |
|---|---|---|---|---|
| 5,115,208 A | * | 5/1992 | Masdea et al. ............... | 331/1 A |
| 5,359,636 A | * | 10/1994 | Aoyama ....................... | 377/73 |
| 6,154,070 A | * | 11/2000 | Ishii ............................ | 327/143 |
| 6,188,286 B1 | * | 2/2001 | Hogl et al. .................... | 331/2 |
| 6,316,966 B1 | * | 11/2001 | Chang et al. .................. | 327/2 |
| 6,771,100 B2 | * | 8/2004 | Ishimi ........................ | 327/142 |
| 6,782,001 B1 | * | 8/2004 | Bachrach .................... | 370/463 |
| 6,795,363 B2 | * | 9/2004 | Nakashima et al. ......... | 365/222 |

FOREIGN PATENT DOCUMENTS

| | | |
|---|---|---|
| JP | 05-094226 | 4/1993 |
| JP | 05-341883 | 12/1993 |
| JP | 08-016276 | 1/1996 |
| JP | 2000-066760 | 3/2000 |
| JP | 2003-273716 | 9/2003 |

* cited by examiner

*Primary Examiner*—N. Drew Richards
*Assistant Examiner*—William Hernandez
(74) *Attorney, Agent, or Firm*—Arent Fox LLP

(57) ABSTRACT

To present a reset control circuit and a reset control method used in a system including clock synchronous circuit, capable of resetting appropriately, especially in case of abnormality, when the clock signal is stopped or its period is longer as compared with the reset response required for detection of abnormal state. A reset control circuit 200 for output control of reset signal RS depending on reset request signal RR comprises a clock transforming unit 210 for transforming and issuing a clock signal CK, while generating a clock output signal RC at delay of clock output waiting period DC depending on the reset request signal RR, and a reset signal generator 220 for generating a reset signal RS at delay of reset output waiting period D depending on the clock output signal RC.

4 Claims, 8 Drawing Sheets

FIRST PRINCIPLE DIAGRAM IN FIRST EMBODIMENT

FIRST PRINCIPLE DIAGRAM IN FIRST EMBODIMENT

CIRCUIT DIAGRAM OF FIRST EMBODIMENT

OPERATION WAVEFORM DIAGRAM OF FIRST EMBODIMENT

CIRCUIT DIAGRAM OF DELAY CIRCUIT

SECOND PRINCIPLE DIAGRAM IN SECOND EMBODIMENT

FIG.6 CIRCUIT DIAGRAM OF SECOND EMBODIMENT

CIRCUIT DIAGRAM OF CLOCK GENERATOR

CIRCUIT DIAGRAM OF SUPPLY VOLTAGE MONITOR UNIT

OPERATION WAVEFORM DIAGRAM OF SECOND EMBODIMENT

RESET CONTROL CIRCUIT AND RESET CONTROL METHOD

CROSS-REFERENCE TO RELATED APPLICATIONS

This application is based upon and claims the benefit of priority from each of the prior Japanese Patent Application No. 2004-332956 filed on Nov. 17, 2004, the entire contents of which are incorporated herein by reference.

BACKGROUND OF THE INVENTION

1. Field of the Invention

The present invention relates to reset control circuit and reset control method of a circuit system, and more particularly to reset control circuit and reset control method for resetting by issuing a reset signal to the system corresponding to a reset request signal, in reset operation in case of abnormality.

2. Description of the Related Art

A circuit system is often used in severe conditions such as unstable supply voltages and large changes in ambient temperature.

A typical example is microcomputer system mounted on an automobile known as car-mount microcomputer system. In the battery for supplying electric power to this car-mount microcomputer system, for example, when driving a self-starter for starting up the engine, the voltage drops significantly, and the supply voltage to be supplied to the system also declines. On the other hand, the automobile compartment may be exposed to high temperature in midsummer. In such circumstances, when the supply voltage is lower than the rated voltage or the ambient temperature is higher than the rated temperature, the car-mount microcomputer system may fail to operate normally. Even in such abnormal state, the car-mount microcomputer system is demanded at least to save the data stored in the RAM or register. Hence, the reset control circuit used in the car-mount microcomputer system is often designed to take in a reset request signal and generate a reset signal in synchronization with clock signal, when commanded from other system or outside, or when abnormal state of supply voltage or ambient temperature is detected.

Some systems of car-mount microcomputer system are designed to operate at lower clock frequency as compared with the reset response requested with respect to detection of abnormal state. Further, such reset operation of the system maybe synchronized with the clock signal.

In the reset control circuit used in such systems, since the reset operation is conducted by using a low clock frequency, the problem that the system cannot be reset right after detection of abnormality occurs. To solve such problem, it may be considered to design a reset control circuit capable of changing over the clock frequency to be supplied in the system simultaneously with reset operation.

The circuit disclosed in Japanese Patent No. 3119628 comprises first clock generating means for generating and issuing a clock signal to be supplied to a clock synchronous type semiconductor storage device in normal operation, and second clock generating means at lower speed. It further comprises a reset circuit for generating a power-on reset signal for a specified period from supply of power by monitoring the power source potential, and a clock changeover circuit for selecting and issuing either one of the output of the first clock generating means and the output of the second clock generating means, depending on the power-on reset signal. The clock changeover circuit supplies the output of the second clock generating means as clock signal to the synchronous type semiconductor storage device when the power-on reset signal is activated. That is, the clock signal supplied to the clock synchronous type semiconductor storage device activates the power-on reset signal, and also changed over from the output of the first clock generating means to the output of the second clock generating means.

Accordingly, by using the control circuit of Japanese Patent No. 3119628, it may be considered to compose a reset control circuit for changing over the output of the clock signal from the first clock generating means to the second clock generating means when activating the reset signal. In this case, reverse to the case of Japanese Patent No. 3119628, the second clock generating means is means for issuing a higher frequency than the first clock generating means. Thus, at the time of detection of abnormal state, the system can be reset more promptly by resetting by using a clock signal of higher frequency.

However, in the reset control circuit for taking in the reset request signal in synchronization with the clock signal, when the frequency of clock signal is low or when the clock signal is stopped, it takes a longer time until the reset request signal is taken in, or the reset request signal may not be taken in.

Or, in a system of resetting synchronously with clock signal, suppose the clock signal is a lower clock frequency as compared with the reset response requested to detection of abnormal state. In this case, as mentioned above, it may be considered to compose a reset control circuit by making use of the circuit disclosed in Japanese Patent No. 3119628. Even by using this means, however, the following problems occur.

By detection of abnormal state, when the clock signal is changed over by activating the reset signal and resetting, suppose it is in the midst of writing cycle of RAM or register. At this time, since the internal bus is initialized, the writing data entered in the RAM or the like is also initialized. In the RAM, moreover, the content of the writing data entered at the moment of resetting is written. That is, the initialized data or unspecified data in the midst of initializing is written in the RAM, which is different from the content intended to be written in, and problems are caused.

SUMMARY OF THE INVENTION

The invention is devised in the light of the above problems, and it is hence an object thereof to present a reset control circuit and a reset control method for resetting appropriately, in a system including a clock synchronous circuit, especially in resetting operation in case of abnormality, when the clock signal is stopped, or when its period is longer as compared with the reset response requested for detection of abnormal state.

To achieve the object, in a first aspect of the invention, a reset control circuit for output control of reset signal depending on reset request signal comprises a reset request delay unit for generating a reset request delay signal which delays the reset request signal by reset output waiting period, a reset request-hold unit for generating a reset request hold signal which is the reset signal held synchronously with the clock signal, and a logical sum operation unit for issuing the logical sum of the reset request delay signal and the reset request hold signal as the reset signal.

According to the first aspect of the invention, the reset control method for output control of reset signal depending on the reset request signal comprises a step of generating a reset request delay signal which delays the reset request signal by reset output waiting period, and a step of generating a reset request hold signal which is held synchronously with the clock signal, and the reset signal is generated at the timing of the signal changing earlier out of the reset request delay signal and the reset request hold signal.

In the reset control circuit and reset control method of the invention, when the reset request signal is activated, the reset request delay unit activates the reset request delay signal after the reset output waiting period. On the other hand, the reset request hold unit activates the reset request hold signal after holding the reset request signal from taking in at the timing synchronized with the clock signal. Further, the reset signal which is the logical sum of the reset request delay signal and the reset request hold signal is activated at the timing of the earlier activation of them.

Therefore, when the reset request signal is taken in synchronously with the clock signal from activation of the reset request signal until the reset output waiting period, since the reset request hold signal has been activated, the reset signal is activated at the timing in synchronization with the clock signal. On the other hand, if the reset request signal is not taken in synchronously with the clock signal, the reset signal is activated by the reset request delay signal.

In the reset control circuit and reset control method of the invention, even if the reset request signal is not taken in promptly in synchronization with the clock signal due to low frequency or stopping of clock signal, the reset signal is issued after the reset output waiting period. That is, if the period is longer as compared with the reset response requested for detection of abnormal state, resetting is operated appropriately in this reset control circuit and reset control method.

In a second aspect of the invention, a reset control circuit for output control of reset signal depending on the reset request signal comprises a clock transforming unit for transforming and issuing clock signal, while generating a clock output signal at delay of clock output waiting period depending on the reset request signal, and a reset signal generator for generating a reset signal at delay of reset output waiting period depending on the clock output signal.

According to the second aspect of the invention, a reset control method for output control of reset signal depending on reset request signal comprises a step of generating a reset request delay signal which delays the reset request signal by reset output waiting period, and a step of generating a reset request hold signal held in synchronization with the clock signal, and the reset signal is generated at the timing of the signal changing earlier out of the reset request delay signal and reset request hold signal.

Or in the second aspect of the invention, the reset control method for output control of reset signal depending on reset request signal comprises a step of waiting until activation of the reset request signal, a step of waiting for clock output waiting period after detection of activation of the reset request signal, and transforming a clock signal, a step of waiting for reset output waiting period after waiting for the clock output waiting period, and a step of generating the reset signal after waiting for the reset output waiting period.

In the reset control circuit and reset control method of the invention, when the reset request signal is activated, a clock output signal is activated at delay of clock output waiting period, and the clock signal is transformed and issued. When the clock output signal is activated, a reset signal is activated at delay of reset output waiting period.

In the reset control circuit and reset control method of the invention, after the clock signal is transformed, a reset signal is activated after reset output waiting period. That is, before the reset signal is activated, the cycle of clock signal can be terminated. For example, in the system including the RAM, after termination of writing cycle of RAM, the reset signal is activated and resetting is operated. In other words, since resetting is not operated in the midst of writing cycle of RAM, destruction of the content can be prevented.

The above and further objects and novel features of the invention will more fully appear from the following detailed description when the same is read in connection with the accompanying drawings. It is to be expressly understood, however, that the drawings are for the purpose of illustration only and are not intended as a definition of the limits of the invention.

DETAILED DESCRIPTION OF THE PREFERRED EMBODIMENTS

The reset control circuit and reset control method of the embodiments of the invention are described below while referring to FIG. 1 to FIG. 9.

Figure 1:
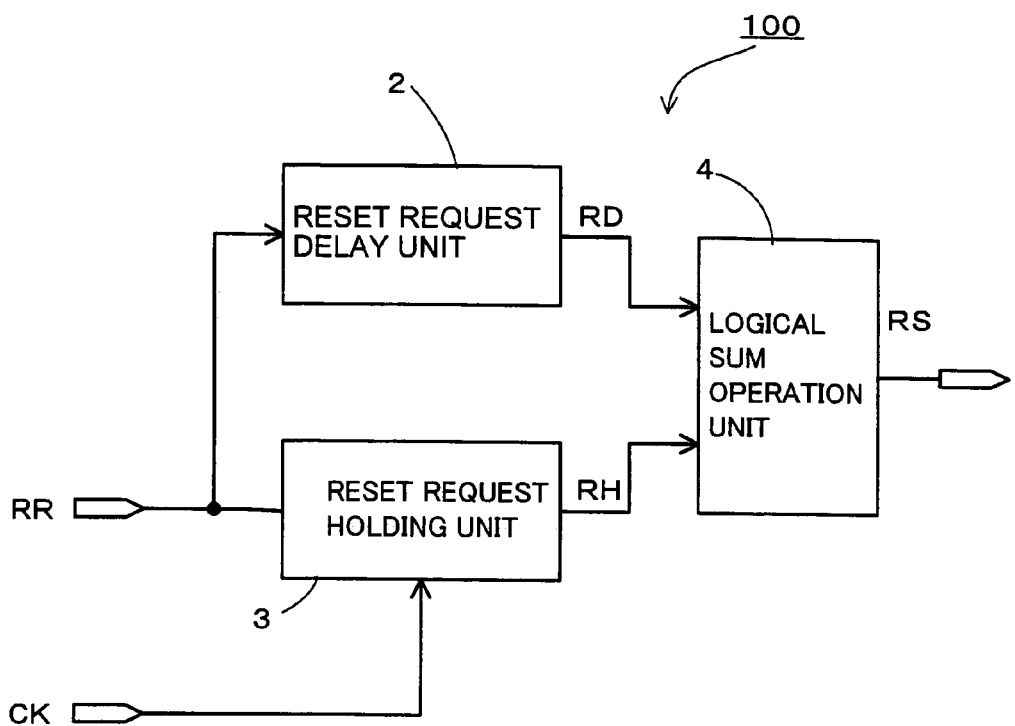
FIG. 1 is a first principle diagram of reset control circuit in a first embodiment.

FIG. 1 is a first principle diagram of reset control circuit 100 in a first embodiment. This reset control circuit 100 and reset control method are described below.

The reset control circuit 100 is a circuit for issuing a reset signal RS depending on a reset request signal RR. The reset control circuit 100 comprises a reset request delay unit 2 for issuing a reset request delay signal RD delaying the reset request signal RR by reset output waiting period D, and a reset request hold unit 3 for issuing a reset request hold signal RH taking in the reset request signal RR in synchronization with clock signal CK. The reset control circuit 100 further comprises a logical sum operation unit 4 for issuing a reset signal RS as logical sum of reset request delay signal RD and reset request hold signal RH.

In the first principle diagram, when the reset request signal RR is activated, the reset request delay unit 2 activates the reset request delay signal RD after reset output waiting period D.

On the other hand, the reset request hold unit 3 activates the reset request hold signal RH by taking in the reset request signal RR at timing in synchronization with clock signal CK.

The reset signal RS is the logical sum of reset request delay signal the and reset request hold signal RH, and is hence activated at the timing of the earliest activation of them.

Therefore, if the reset request signal RR is taken in synchronously with clock signal CK before reset output waiting period D after activation of reset request signal RR, the reset signal RS is activated at the timing synchronized with the clock signal CK because the reset request hold signal RH is activated. On the other hand, if the reset request signal RR is not taken in synchronously with the clock signal CK, the reset signal RS is activated by the reset request delay signal RD.

By using the reset control circuit 100 and reset control method of embodiment 1, even if the reset request signal RR cannot be taken in promptly in synchronization with clock signal CK due to low frequency or stopping of clock signal CK, the reset signal RS is issued after the reset output waiting period D. That is, in spite of state of clock signal CK such as longer period as compared with reset response requested for detection of abnormal state, the reset control circuit and reset control method are capable of generating reset signal RS appropriately.

The reset signal RS is connected to a reset input of a system not shown (for example, car-mount microcomputer system). When the reset signal RS is activated, the flip-flop of clock synchronous circuit is initialized. As a result, the operation sequence of the system is initialized, and its operation is stopped (hereinafter called reset state).

The reset request signal RR is an input-signal requesting the reset control circuit 100 for output of reset signal RS. The reset request signal RR may be manual reset request, reset request from other system, other external signal, or detection signal of abnormality in supply voltage or temperature. By using such abnormality detection signal, the system can be immediately reset in the event of abnormality in ambient supply voltage or temperature, and trouble due to system runaway or the like can be prevented.

The reset request delay unit 2 is not particularly specified in structure as far as it receives the reset request signal RR, and generates delay of reset output waiting period D from this input. Specific examples include the analog type delay circuit using CR time constant, and digital type delay circuit composed of timer circuit using clock.

The reset control circuit 100 of embodiment 1 is often used in reset operation in case of abnormality. In such condition, oscillation of clock signal tends to be unstable. By contrast, the analog type delay circuit does not require clock in its operation, and can operate securely regardless of abnormal ambient condition, and is hence more preferable.

The reset request hold unit 3 is intended to hold the reset request signal RR in synchronization with clock signal CK, which may be realized, for example, by flip-flop circuit or latch circuit.

The logical sum operation unit 4 is not specified as far as it is capable of calculating the logical sum, and an OR circuit composed of logic gates, or a wired OR circuit electrically coupling an output buffer of open collector (drain) may be used. Herein, the logical sum includes both positive logic and negative logic. In an actual circuit, hence, AND circuit is used in the case of negative logic, and OR circuit in the case of positive logic.

The duration of reset output waiting period D may be a duration including at least one period of clock signal CK. In embodiment 1, the duration of reset output waiting period D is about 2.5 periods of clock signal CK. By defining such duration, when the clock signal CK is not stopped, the reset request signal RR can be taken in synchronously with the clock signal CK, and the reset operation in synchronization with the clock signal CK is realized. Accordingly, for example, in the RAM in write cycle or the like, trouble (e.g. its destruction) due to interruption of operation can be prevented. More preferably, the duration of reset output waiting period D should be as short as possible within the scope of the duration including the period of clock signal CK. As a result, when the clock signal CK is stopped, the reset signal RS can be activated earlier, and asynchronous reset operation can be done promptly.

Figure 2:
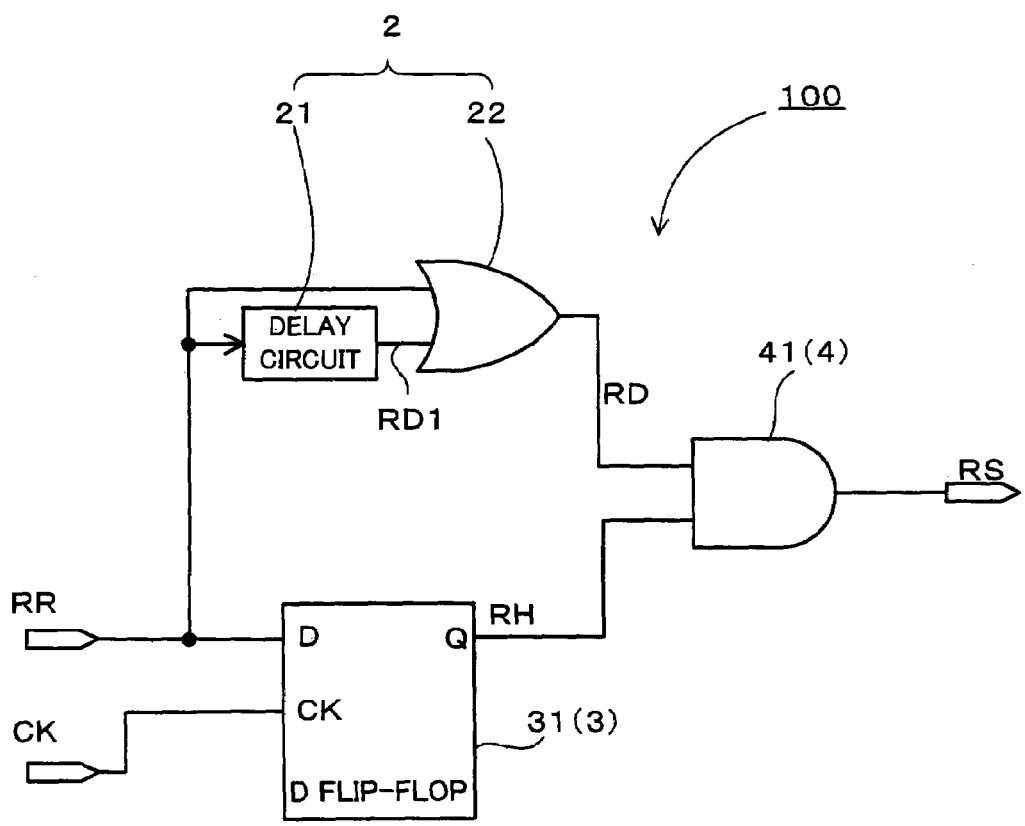
FIG. 2 is a circuit diagram of reset control circuit in the first embodiment.

The reset control circuit 100 in the first embodiment shown in FIG. 2 has a circuit configuration conforming to the first principle diagram (FIG. 1). That is, the reset control circuit 100 comprises a reset request delay unit 2 composed of delay circuit 21 and two-input OR circuit 22, a reset request hold unit 3 composed of flip-flop 31, and a logical sum operation unit 4 composed of two-input AND circuit 41. The reset request signal RR and reset signal RS are input and output signals of negative logic. In the specification, a signal of negative logic is a signal of inactive state in the case of high level, or a signal of active state in the case of low level. The active state of a signal refers to a state of commanding the content intended by the signal.

The reset request delay unit 2 includes delay circuit 21 for generating a delay signal RD1 by delaying the input signal by reset output waiting period D, and two-input OR circuit 22. The input of delay circuit 21, and one of the inputs of two-input OR circuit 22 are connected to the reset request signal RR. Other input of two-input OR circuit 22 is connected to the output of the delay circuit 21. The reset request delay signal RD of the reset request delay unit 2 is also a signal of negative logic.

In the reset request delay unit 2, when the reset request signal RR becomes low level, another input of the two-input OR circuit 22 becomes low level, but other input remains at high level until expiration of reset output waiting period D. After the reset output waiting period D, the output of the two-input OR circuit 22 becomes low level. If the reset request signal RR becomes high level before the end of the reset output waiting period D, the output of the two-input OR circuit 22 remains at high level without once becoming low level. That is, in this reset request delay unit 2, when the duration of low level of reset request signal RR is shorter than the duration of reset output waiting period D, the reset request delay signal RD is not activated. Therefore, if noise or the like is entered in the reset request signal RR, it can be eliminated as far as shorter than the duration of reset output waiting period D.

Figure 3A:
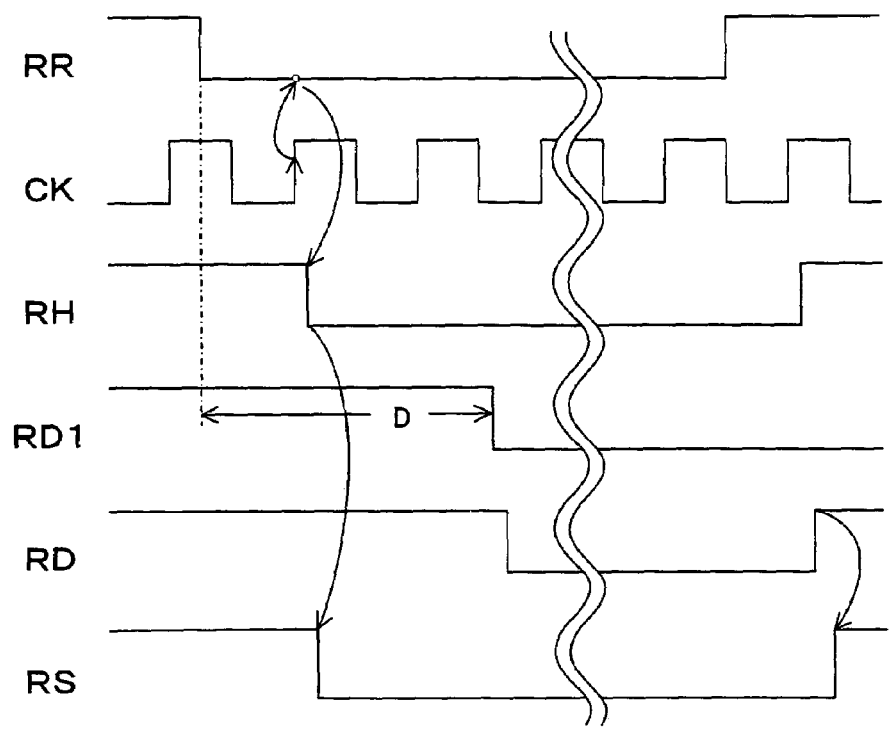
FIGS. 3A, B are operation waveform diagrams of reset control circuit in the first embodiment.
Figure 3B:
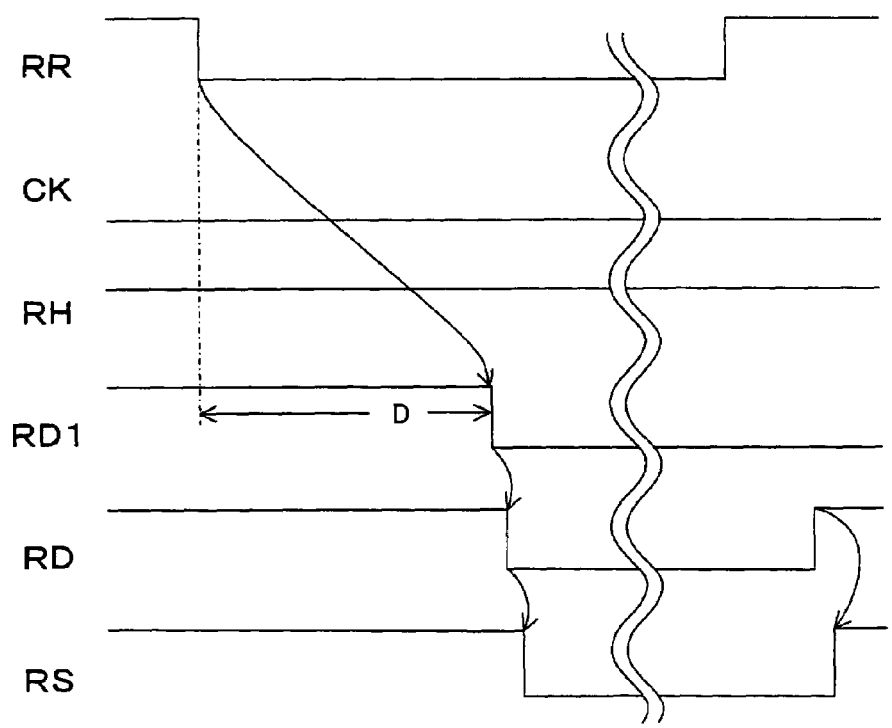

FIG. 3A shows a specific operation waveform in the case of input of clock signal CK having shorter period than the reset output waiting period D, and FIG. 3B shows a specific operation waveform in the case of stop of clock signal CK.

In the operation waveform in FIG. 3A, the reset request signal RR is changed to low level, and is taken in synchronously with the leading edge of clock signal CK in the flip-flop 31 (reset request hold unit 3). Hence, the reset request hold signal RH which is the output of the flip-flop 31 is changed to low level. When the reset request hold signal RH is changed to low level, the logical product is operated (logical sum of negative logic is operated) in the two-input AND circuit 41, and the output of the two-input AND circuit 41, that is, the reset signal RS is changed to low level. In this case, therefore, the reset signal RS is issued in synchronization with the clock signal CK.

In the operation waveform in FIG. 3B, on the other hand, when the reset request signal RR is changed to low level, the reset request delay signal RD is also changed to low level after reset output waiting period D. On the other hand, the reset request hold signal RH remains at high level and is not changed. As a result, the reset signal RS is changed to low level at the timing of reset request delay signal RD. In this case, the reset signal RS is issued at asynchronous timing from the clock signal CK.

In the reset control circuit 100 of embodiment 1, if possible, the reset signal RS can be activated in synchronization with the clock signal CK. On the other hand, if it is impossible due to stop of clock signal CK or other cause, the reset signal RS can be activated asynchronously from clock signal CK. That is, regardless of the state of clock signal CK, the reset operation can be executed securely in this reset control circuit 100 and reset control method.

Figure 4:
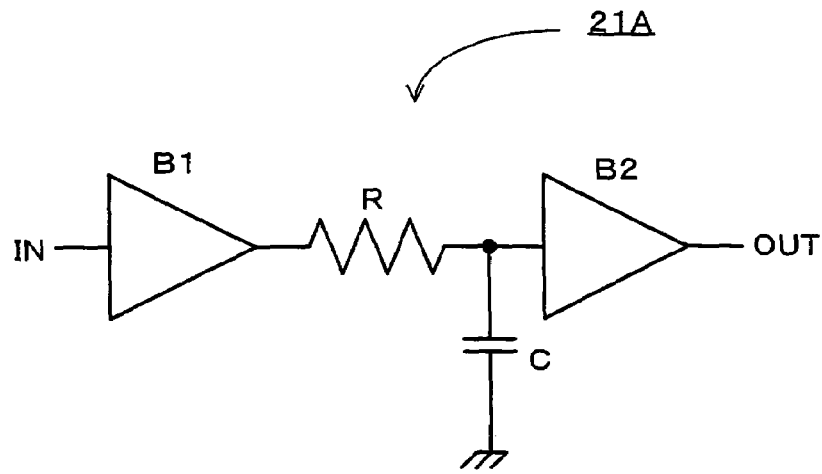
FIG. 4 is a circuit diagram of delay circuit included in reset control circuit in first and second embodiments.

A specific delay circuit 21A is shown in FIG. 4. This delay circuit 21A includes a buffer B1, a buffer B2, a resistive element R connected between output of buffer B1 and input of buffer B2, and a capacitive element C connected between input of buffer B2 and ground VS. When a signal is entered from input terminal IN, delay of reset output waiting period D is generated by CR time constant circuit composed of resistive element R and capacitive element C. This delay signal is issued from output terminal OUT by way of buffer B2.

By adjusting at least one of the resistive element R and capacitive element C, the CR time constant can be changed, and the duration of the reset output waiting period D by delay of CR time constant circuit can be adjusted. Further, as mentioned above, by adjusting the duration of the reset output waiting period D to be longer than one period of clock signal CK, while the clock signal CK is not stopped, the reset signal RS can be activated always synchronously with clock signal CK. Hence, the reset control circuit 100 and reset control method capable of executing optimum reset operation can be realized.

Figure 5:
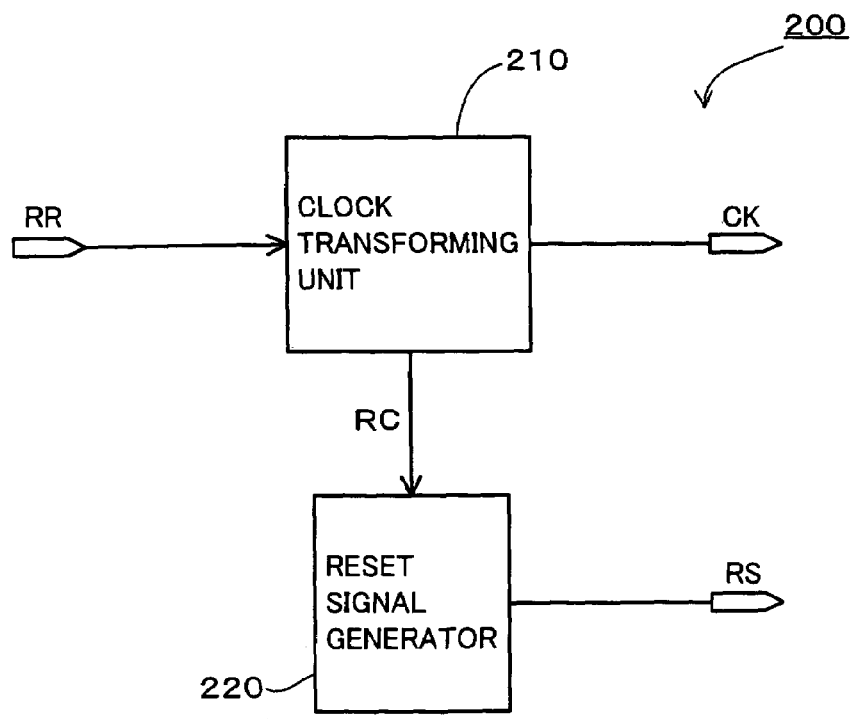
FIG. 5 is a second principle diagram of reset control circuit in the second embodiment.

FIG. 5 is a second principle diagram of reset control circuit 200 in a second embodiment. This reset control circuit 200 and reset control method are described below.

The reset control circuit 200 is a circuit for controlling the clock signal CK and reset signal RS depending on the reset request signal RR. This reset control circuit 200 comprises a clock transforming unit 210 for transforming a clock signal CK depending on reset request signal RR, and a reset signal generator 220 for issuing a reset signal RS. The clock transforming unit 210 is a section for transforming the clock signal CK depending on the activation of reset request signal RR. The clock transforming unit 210 also activates the clock output signal RC by delay of clock output delay period DC. The reset signal generator 220 activates the reset signal RS at delay of reset output waiting period D when the clock output signal RC is activated.

The reset signal RS is connected to a reset input of a system not shown (for example, car-mount microcomputer system). When the reset signal RS is activated, the flip-flop of clock synchronous circuit included in the system is initialized. As a result, the operation sequence of the system is initialized, and the system operation is stopped to be set in reset state.

The reset request signal RR is an input signal requesting the reset control circuit 200 for output of reset signal RS. The reset request signal RR may use, for example, manual reset request, reset request from other system, other external signal, or detection signal of abnormality in supply voltage or temperature. By using such abnormality detection signal, the system can be immediately reset in the event of abnormality in ambient supply voltage or temperature, and trouble due to system runaway or the like can be prevented.

The duration of reset output waiting period D is required to be long enough to include at least the duration of one period of clock signal CK after transformation. In the reset control circuit 200 of embodiment 2, the duration of reset output waiting period D is defined to be about 1.5 periods of clock signal CK after transformation.

In the reset control circuit 200, after transforming the clock signal CK, the reset signal RS is activated after reset output waiting period D. That is, the cycle of clock signal CK is terminated before the reset signal RS is activated. For example, in the case of the RAM included in the system, the write cycle of RAM is terminated before the reset signal RS is activated. Therefore, since reset operation is not done in the write cycle, destruction of content of the RAM can be prevented.

Prior to reset operation, meanwhile, preparatory process may be required, such as register evasion of system or changeover to low power consumption mode. If sequence operation is included in the preparatory process, the number of clocks corresponding to the number of execution steps is needed. In such a case, the reset output waiting period D is adjusted. For example, when the reset output waiting period D is set longer, the number of clock pulses included in the clock prior to reset operation can be increased.

Transformation of clock signal CK is to change the waveform state of clock signal CK in a shorter period than the length of reset response required for detection of abnormal state. Specifically, for example, the phase or frequency of clock signal CK is changed.

Means or method for changing the phase of clock signal CK includes means or method for inverting or delaying the clock signal CK.

Means or method for changing the frequency of clock signal CK includes means or method for changing the frequency dividing ratio by using known frequency divider, or means or method for changing the PLL oscillation frequency by using known PLL circuit. When the frequency of clock signal CK is changed from low frequency to high frequency, more clock pulses can be included in the clock signal CK within the reset output waiting period D. That is, when the sequence operation is included in the preparatory process, the clock signal CK including the number of clock pulses corresponding to the number of steps of preparatory process in a shorter reset output waiting period D can be generated.

Figure 6:
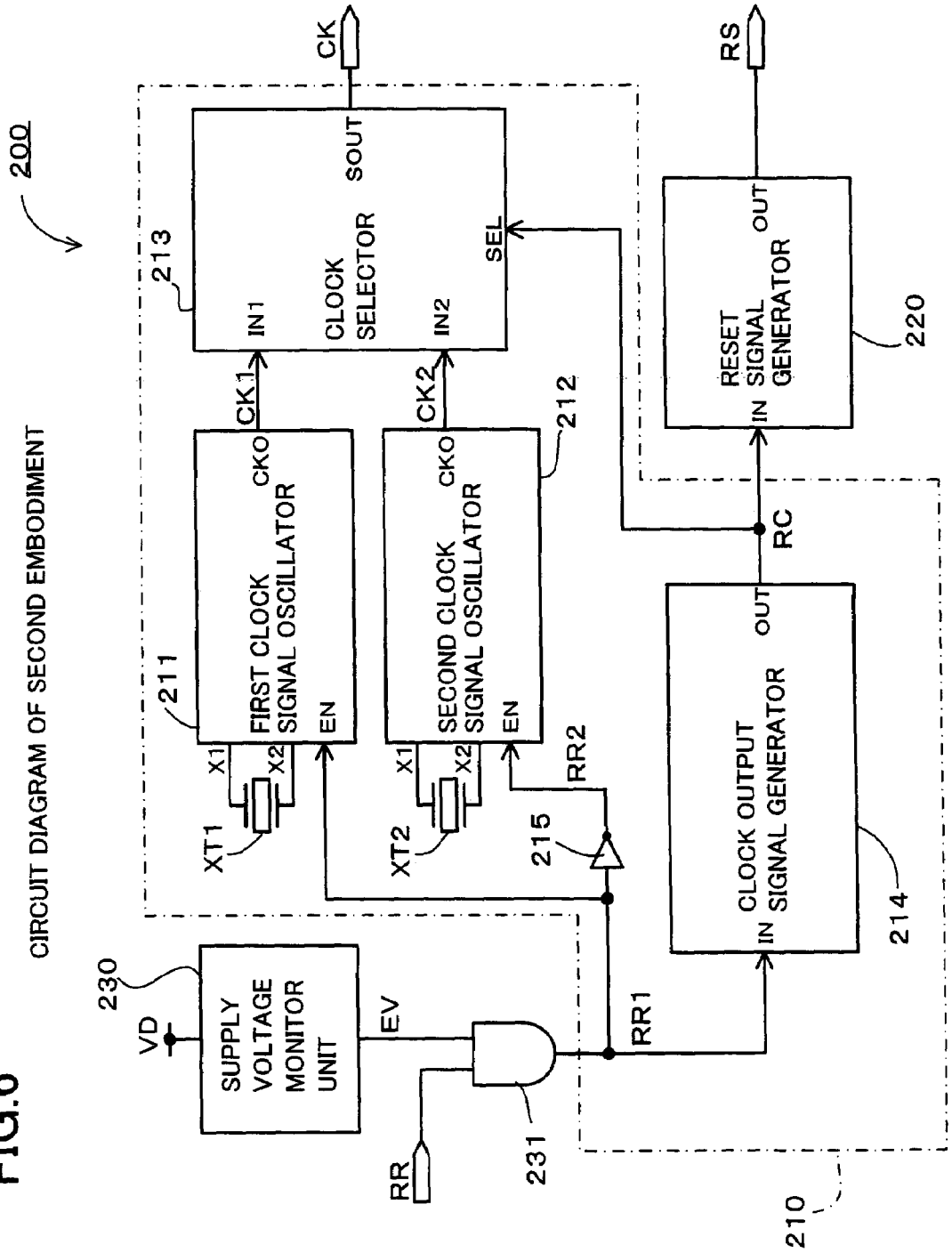
FIG. 6 is a circuit diagram of reset control circuit in the second embodiment.

The reset control circuit 200 in the second embodiment shown in FIG. 6 includes the circuit configuration conforming to the second principle diagram (FIG. 5). That is, the reset control circuit 200 comprises a clock transforming unit 210 composed of a first clock signal oscillator 211 including first crystal oscillator XT1, a second clock signal oscillator 212 including second crystal oscillator XT2, a clock selector 213, a clock signal oscillator 214, and an inverter 215, and a reset signal generator 220.

The reset control circuit 200 further comprises a supply voltage monitor unit 230 and an AND circuit 231. The supply voltage monitor unit 230 issues a low level to the voltage abnormality signal EV when the supply voltage VD becomes lower than a specified voltage VL as described below. The AND circuit 231 receives reset request signal RR and voltage abnormality signal EV, and calculates the logical product (logical sum of negative logic) of them and issues internal reset request signal RR1. That is, when either the reset request signal RR or voltage abnormality signal EV becomes low level, the internal reset request signal RR1 becomes low level.

The first clock signal oscillator 211 has crystal connection terminals X1, X2 for connecting the first crystal oscillator XT1, and also oscillation enable terminal EN and clock output terminal CKO.

Figure 7:
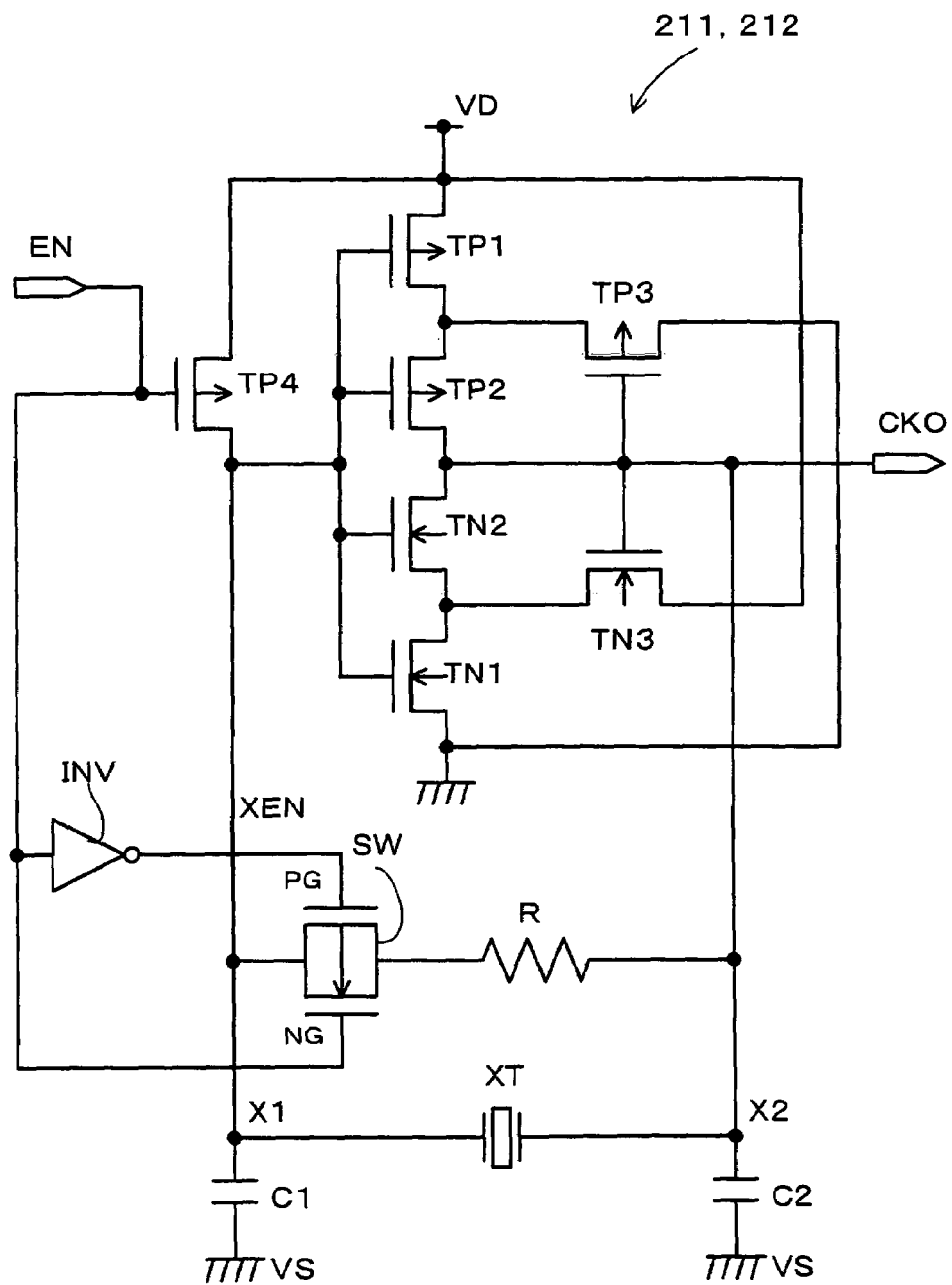
FIG. 7 is a circuit diagram of clock generating unit included in the reset control circuit in the second embodiment.

FIG. 7 shows a transistor circuit diagram of first clock signal oscillator 211. The first clock signal oscillator 211 includes an output inverter composed of PMOS transistors TP1, TP2 and NMOS transistors TN1, TN2, and a feedback inverter composed of PMOS transistor TP3 and NMOS transistor TN3. In the crystal connection terminals X1, X2 at both ends, feedback resistive element R having analog switch SW connected in series and first crystal oscillator XT1 are connected. Further, oscillation capacitive elements C1, C2 are connected to the crystal connection terminals X1, X2 respectively.

In the first clock signal oscillator 211, the oscillation enable terminal EN is connected to output fixing PMOS transistor TP4 connected to crystal connection terminal X1, inverter INV, and NMOS gate input NG of analog switch SW. The output of the inverter INV is connected to the PMOS gate input PG of analog switch SW.

When the oscillation enable terminal EN is set to high level in the first clock signal oscillator 211, the PMOS transistor TP4 is turned off and the analog switch SW is turned on, and the oscillation circuit composed of output inverter, feedback inverter, first crystal oscillator XT1, feedback resistive element R, and oscillation capacitive elements C1, C2 comes to function, and a clock signal is issued from the clock output terminal CKO. On the other hand, when the oscillation enable terminal EN is set to low level, the PMOS transistor TP4 is turned on, and the potential of the crystal connection terminal X1 is fixed at high level and oscillation stops, and a low level is issued to the clock output terminal CKO.

The second clock signal oscillator 212 is same as the first clock signal oscillator 211 except for the oscillation frequency of second crystal oscillator XT2.

In the reset control circuit 200 in the second embodiment, a crystal oscillator of oscillation frequency of 32 kHz is used in the first crystal oscillator XT1, and a crystal oscillator of oscillation frequency of 32 MHz is used in the second crystal oscillator XT2.

Back to FIG. 6, in the reset control circuit 200 in embodiment 2, an internal reset request signal RR1 is connected to the oscillation enable terminal EN of the first clock signal oscillator 211, and an internal reset request signal RR2 is connected to the oscillation enable terminal EN of the second clock signal oscillator 212. The internal reset request signal RR2 is an inverted output of an inverter 215 of which input is connected to the internal reset request signal RR1. Therefore, when the internal reset request signal RR1 is at high level, the first clock signal oscillator 211 oscillates, and hence a clock signal CK1 is issued to its clock output terminal CKO. On the other hand, when the internal reset request signal RR1 is at low level (when the internal reset request signal RR2 is at high level), the second clock signal oscillator 212 oscillates, and hence a clock signal CK2 is issued to its clock output terminal CKO.

The clock selector 213 is a circuit for selecting and issuing one of the clock signals CK1 and CK2 issued from the first clock signal oscillator 211 and second clock signal oscillator 212.

The clock selector 213 has a known selector circuit, and issues a signal entered in the input terminal IN1, when a high level is entered in the selection signal terminal SEL, to the output terminal OUT, or a signal entered in the input terminal IN2 when a low level is entered.

More specifically, a clock output signal RC is connected to the selection signal terminal SEL, a clock signal CK1 to the input terminal IN1, and a clock signal CK2 to the input terminal IN2. Therefore, when the clock output signal RC is at high level, the clock signal CK1 is issued, and when the clock output signal RC is at low level, the clock signal CK2 is issued.

Hence, when the internal reset request signal RR1 is at high level, the first clock signal oscillator 211 oscillates, and issues a clock signal CK1 to the clock output terminal CKO, while the second clock signal oscillator 212 does not oscillate, and issues a low level to the clock output terminal CKO. When the clock output signal RC becomes high level, the clock selector 213 selects and issues a signal of input terminal IN1, and a clock signal CK1 is issued to the output terminal OUT.

On the other hand, when the internal reset request signal RR1 is at low level, the first clock signal oscillator 211 does not oscillate, and issues a low level to the clock output terminal CKO, while the second clock signal oscillator 212 oscillates, and issues a clock signal CK2 to the clock output terminal CKO. When the clock output signal RC becomes low level, the clock selector 213 selects and issues a signal of input terminal IN2, and a clock signal CK2 is issued to the output terminal OUT.

Therefore, in the reset control circuit 200 of embodiment 2, either one of the first clock signal oscillator 211 and second clock signal oscillator 212 oscillates, corresponding to the clock signal to be selected by the clock selector 213 depending on the internal reset request signal RR1. Hence, as compared with the case of oscillating both first clock signal oscillator 211 and second clock signal oscillator 212, the reset control circuit 200 and reset control method are saved in power consumption.

The clock output signal generator 214 generates a clock output signal RC at delay of clock output waiting period DC. The clock output signal generator 214 is composed of delay circuit 21A (FIG. 4). That is, the clock output signal generator 214 issues the signal received in the input terminal IN to the output terminal OUT at delay of clock output waiting period DC determined by the CR time constant. By the adjustment of the value of resistive element R or capacitive element C, the duration of clock output waiting period DC is nearly same as the duration from start of oscillation of the clock signal CK2 in the second clock signal oscillator 212 until the oscillation is stabilized.

The reset signal generator 220 generates a reset signal RS at delay of reset output waiting period D depending on the clock output signal RC. The reset signal generator 220 is composed of delay circuit 21A (FIG. 4). The reset signal generator 220 issues the signal received in the input terminal IN to the output terminal OUT at delay of reset output waiting period D determined by the CR time constant. By the adjustment of the value of resistive element R or capacitive element C, the duration of reset output waiting period D can be controlled.

Figure 8:
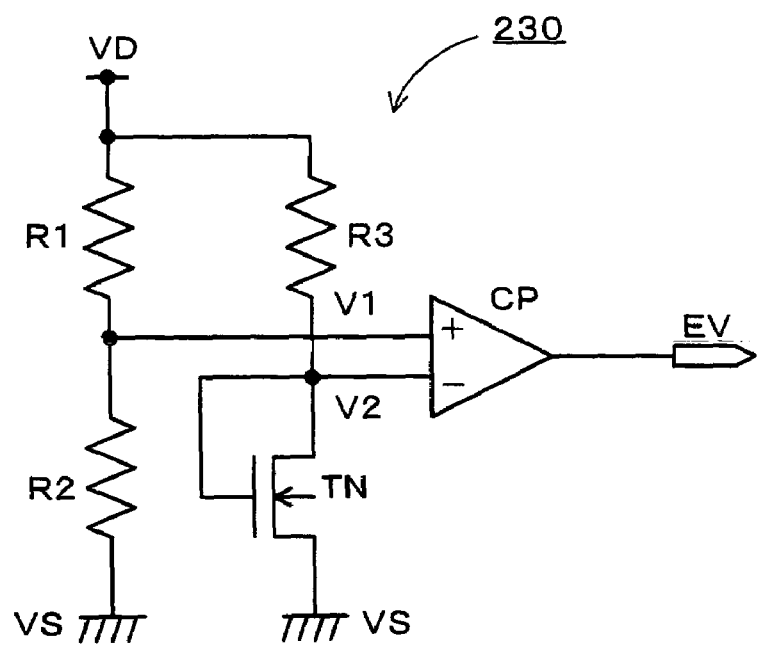
FIG. 8 is a circuit diagram of supply voltage monitor unit included in the reset control circuit in the second embodiment.

The supply voltage monitor unit 230 shown in FIG. 8 is a circuit for issuing a low level to voltage abnormality signal EV when the supply voltage becomes lower than a specified voltage VL. The supply voltage monitor unit 230 includes resistive elements R1, R2, R3, reference NMOS transistor TN, and comparator CP having plus input IP and minus input IM. Between the supply voltage VD and ground VS, the resistive elements R1 and R2, and the resistive element R3 and reference NMOS transistor TN are connected in series. At the plus input IP of comparator CP, an intermediate level V1 at junction of resistive elements R1 and R2 is connected, and at the minus input IM, an intermediate level V2 at junction of resistive element R3 and reference NMOS transistor TN is connected, respectively.

The comparator CP compares the input voltages at plus input IP and minus input IM, and issues high level or low level depending on the result of comparison. More specifically, when the voltage between the plus input IP and minus input IM is a positive value, a high level is issued, and when it is a negative-value, a low level is issued. Therefore, when the intermediate level V1>intermediate level V2, the comparator CP issues a high level, and when the intermediate level V1≦intermediate level V2, a low level is issued.

The voltage of intermediate level V1 varies with the supply voltage VD. That is, it is determined by a simple resistance dividing ratio of resistive elements R1 and R2. On the other hand, the voltage of intermediate level V2 is held at threshold voltage Vth of reference NMOS transistor TN (however, when the supply voltage VD exceeds the threshold voltage Vth) because the gate and drain of reference NMOS transistor TN are short-circuited. Therefore, by properly adjusting the resistive elements R1 and R2, the specified voltage VL can be determined.

In the car-mount microcomputer system, in order to monitor drop of supply voltage, a supply voltage monitor circuit is provided in an external circuit, and when the supply voltage becomes abnormal, the detection output is activated, and its abnormality is noticed. However, if the supply voltage monitor circuit is provided in an external circuit, transmission of detection output may be delayed, or a signal abnormality due to drop of supply voltage in the midst of transmission may occur, and detection output of abnormal state may not be transmitted correctly.

By contrast, in the reset control circuit 200 of embodiment 2, since the supply voltage monitor unit 230 is incorporated, if the supply voltage drops to be in abnormal state, it is promptly detected, and fed back to the operation of the reset control circuit 200. Hence, the abnormal state of supply voltage can be securely detected, and reset operation is realized reliably in the reset control circuit 200 and reset control method.

Figure 9:
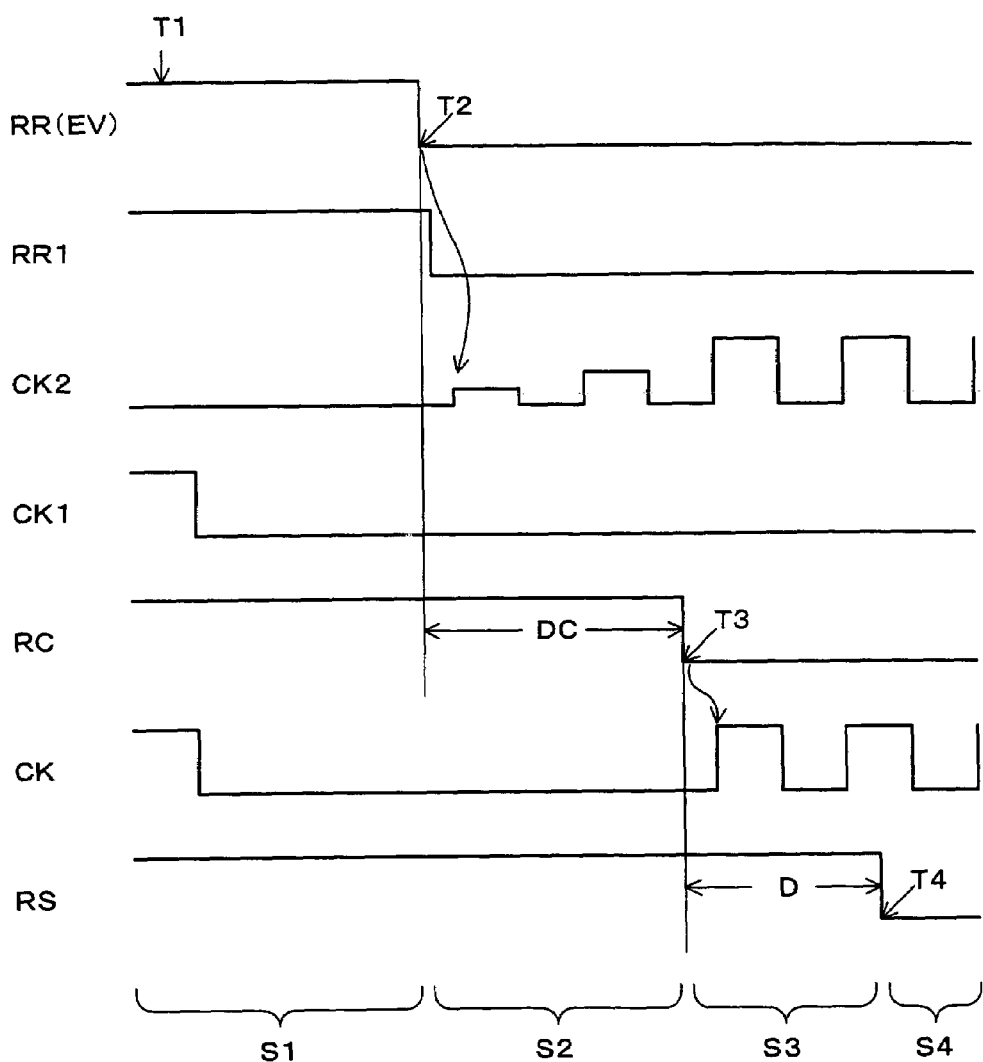
FIG. 9 is an operation waveform diagram of reset control circuit in the second embodiment.

A specific operation waveform is shown in FIG. 9.

The reset control circuit 200 of embodiment 2 controls and issues the clock signal CK and reset signal RS depending on the input of reset request signal RR or the voltage abnormality signal EV issued due to drop of supply voltage VD. The reset request signal RR is a signal of negative logic, showing a voltage of high level when not activated, and low level when activated.

While the system is not abnormal, the reset control circuit 200 issues a high level to the reset request signal RR, and a clock signal CK1 to the clock signal CK (T1 in the diagram).

When the reset request signal RR is activated and is changed to low level, the internal reset request signal RR1 is changed to low level. Consequently, the first clock signal oscillator 211 stops its oscillation, while the second clock signal oscillator 212 starts its oscillation (T2 in the diagram).

In the clock output waiting period DC after change of internal reset request signal RR1 to low level, the clock output signal RC is changed from high level to low level. At the same time, the clock selector 213 issues a clock signal CK2 to its output terminal OUT (T3 in the diagram).

Further, in the reset output waiting period D after change of clock output signal RC to low level, the reset signal RS is changed from high level to low level, and is activated (T4 in the diagram).

From a different point of view, the reset control circuit 200 controls the reset signal RS and the clock signal CK in the following method. That is, this reset control method comprises step S1 of waiting for activation of reset request signal RR, step S2 of waiting for clock output waiting period DC after detection of activation of reset request signal RR and transforming the clock signal CK, step S3 of waiting for reset output waiting period D after waiting for clock output waiting period DC, and step S4 of generating a reset signal RS after waiting for reset output waiting period D, and these steps are executed in this sequence.

As described herein, according to the reset control circuit 200 of embodiment 2, before the reset signal RS is activated, the clock signal CK is issued, and the reset operation can be executed in a completely terminated state of the operation being done before activation of the reset request signal RR. Therefore, by using the reset control circuit 200 and reset control method, the reset operation can be done appropriately without destroying the contents of the RAM and others.

Activation of reset request signal RR is explained above, but when the supply voltage VD is lowered and the voltage becomes lower than the specified voltage VL, as mentioned above, the supply voltage monitor unit 230 activates the voltage abnormality signal EV. This voltage abnormality signal EV is fed into the AND circuit 231 together with the reset request signal RR, and thereafter the operation is same as in the case of activation of reset request signal RR.

Incidentally, drop of supply voltage (for example, lower than specified voltage VL) may be detected in a circuit outside of the system, and a reset request may be generated. However, between the external circuit and the system, the characteristic may differ when the supply voltage is lowered due to difference in power consumption or the like. For example, when the power consumption in the external circuit including the circuit for monitoring the supply voltage is smaller than that in the system, as compared with the drop of supply voltage VD of the system, the drop of supply voltage in the external circuit is delayed. Hence, if the supply voltage drops and the supply voltage VD is lower than the specified voltage VL in the system, in the external circuit, the supply voltage is not lower yet than the specified voltage VL, and reset request is not generated. That is, the reset request timing when the supply voltage is lowered is delayed from the required timing. That is, when the voltage is monitored by an external circuit of the system, the characteristic when the supply voltage drops differs between the position (external circuit) for referring to for monitoring the voltage and the position (system) demanding reset request, and reset request may not be generated at an appropriate timing.

The reset control circuit 200 of embodiment 2, on the other hand, incorporates the power supply monitor unit 230 which generates an internal reset request signal RR1 (reset request signal) when the supply voltage VD is lowered. That is, the characteristic when the voltage drops is the same between the position for referring to for monitoring the voltage and the position demanding reset request, and the above problem does not occur. Hence, the reset control circuit 200 detects drop of supply voltage, and generates a reset request at an appropriate timing.

The invention is not limited to these embodiments alone, but may be freely changed and modified within the scope not departing from the true spirit of the invention.

For example, in the embodiments, the clock generating circuit and delay circuit composed by using MOS type transistors are explained, but the invention is not limited to them alone, but may be similarly applied inn various circuits composed by using bipolar transistors and others.

The invention hence presents the reset control circuit and reset control method used in the system including clock synchronous circuit, capable of resetting appropriately, especially in case of abnormality, when the clock signal is stopped or its period is longer as compared with the reset response required for detection of abnormal state.

What is claimed is:

1. A reset control circuit for output control of a reset signal depending on a reset request signal comprising:
   a reset request delay unit for generating a reset request delay signal which delays the reset request signal for a reset output waiting period, wherein an output signal of the reset request delay unit changes to a polarity the same as a polarity that an input signal of the reset request delay unit has changed to prior to the output signal;
   a reset request hold unit for generating a reset request hold signal which is the reset request signal held synchronously with a clock signal; and
   a logical sum operation unit for issuing the logical sum of the reset request delay signal and the reset request hold signal as the reset signal.

2. The reset control circuit of claim 1,
   wherein the duration of the reset output waiting period for delay in the reset request delay unit is long enough to include one period of the clock signal.

3. A reset control method for output control of a reset signal depending on a reset request signal comprising:
   generating a reset request delay signal which delays the reset request signal by reset output waiting period wherein the reset request delay signal changes to a polarity the same as a polarity that the reset request delay signal has changed to prior to the reset request delay signal; and
   generating a reset request hold signal which is the reset request signal held synchronously with a clock signal,
   wherein the reset signal is generated based on a change of either the reset request delay signal or the reset request hold signal, whichever changes earlier.

4. The reset control method of claim 3,
   wherein the duration of the reset output waiting period is long enough to include the period of the clock signal.

* * * * *